(12) United States Patent
Choi (10) Patent No.: US 11,908,824 B2
(45) Date of Patent: Feb. 20, 2024

(54) SEMICONDUCTOR PACKAGE, METHOD OF MANUFACTURING THE SAME AND METAL BRIDGE APPLIED TO THE SEMICONDUCTOR PACKAGE

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 196 days.

(21) Appl. No.: 17/567,168

(22) Filed: Jan. 3, 2022

(65) Prior Publication Data
US 2022/0359452 A1 Nov. 10, 2022

(30) Foreign Application Priority Data
May 4, 2021 (KR) .......... 10-2021-0057916

(51) Int. Cl.
*H01L 23/00* (2006.01)
*H01L 25/065* (2023.01)
*H01L 23/498* (2006.01)

(52) U.S. Cl.
CPC ........ *H01L 24/48* (2013.01); *H01L 23/49822* (2013.01); *H01L 24/29* (2013.01); *H01L 24/32* (2013.01); *H01L 24/37* (2013.01); *H01L 24/41* (2013.01); *H01L 24/45* (2013.01); *H01L 24/73* (2013.01); *H01L 25/0655* (2013.01); *H01L 2224/29111* (2013.01); *H01L 2224/29139* (2013.01); *H01L 2224/29147* (2013.01); *H01L 2224/32225* (2013.01); *H01L 2224/3701* (2013.01); *H01L 2224/404* (2013.01); *H01L 2224/411* (2013.01); *H01L 2224/4516* (2013.01); *H01L 2224/45147* (2013.01); *H01L 2224/48091* (2013.01); *H01L 2224/48225* (2013.01); *H01L 2224/48491* (2013.01); *H01L 2224/73265* (2013.01); *H01L 2924/35* (2013.01)

(58) Field of Classification Search
CPC ..................................................... H01L 24/29
See application file for complete search history.

(56) References Cited

U.S. PATENT DOCUMENTS

2020/0203253 A1* 6/2020 Sakakibara ......... H01L 21/4882

FOREIGN PATENT DOCUMENTS

| JP | 2001-091539 A | 4/2001 |
|---|---|---|
| JP | 2017-139304 A | 8/2017 |
| KR | 10-2001-0111736 A | 12/2001 |
| KR | 10-2002-0094593 A | 12/2002 |
| KR | 10-0867573 B1 | 11/2008 |
| KR | 10-1482911 B1 | 1/2015 |
| KR | 10-1643332 B1 | 7/2016 |
| KR | 10-2172689 B1 | 11/2020 |
| KR | 10-2196397 B1 | 12/2020 |

* cited by examiner

*Primary Examiner* — Yu-Hsi D Sun
(74) *Attorney, Agent, or Firm* — Park, Kim & Suh, LLC

(57) ABSTRACT

The present invention relates to a semiconductor package in which a metal bridge, which is bent and has elasticity and a non-vertical structure, may protect a semiconductor chip in such a way that push-stress occurring while molding is relieved by being absorbed or dispersed by being diverted, a method of manufacturing the same, and the metal bridge applied to the semiconductor package.

20 Claims, 12 Drawing Sheets

SEMICONDUCTOR PACKAGE, METHOD OF MANUFACTURING THE SAME AND METAL BRIDGE APPLIED TO THE SEMICONDUCTOR PACKAGE

CROSS-REFERENCE TO RELATED PATENT APPLICATION

This application claims the benefit of Korean Patent Application No. 10-2021-0057916, filed on May 4, 2021, in the Korean Intellectual Property Office, the disclosure of which is incorporated herein in its entirety by reference.

BACKGROUND OF THE INVENTION

1. Field of the Invention

The present invention relates to a semiconductor package in which a metal bridge, which is bent and has elasticity and a non-vertical structure, may protect a semiconductor chip in such a way that push-stress occurring while molding is relieved by being absorbed or dispersed by being diverted, a method of manufacturing the same, and the metal bridge applied to the semiconductor package.

2. Description of the Related Art

In general, a semiconductor package includes a semiconductor chip installed on a lower substrate or an upper substrate, a conductor which is a metal post used as a spacer adhered on the semiconductor chip, a lead frame formed of Cu for applying an external electrical signal, and a package housing molded by a sealing member. Here, the semiconductor chip is bonded on a lead frame pad, and a plating layer formed of Ag is included on the upper part of a lead frame lead. Accordingly, the lead frame lead and a semiconductor chip pad are electrically connected to each other by using a bonding wire, which is a signal line.

Figure 1A:
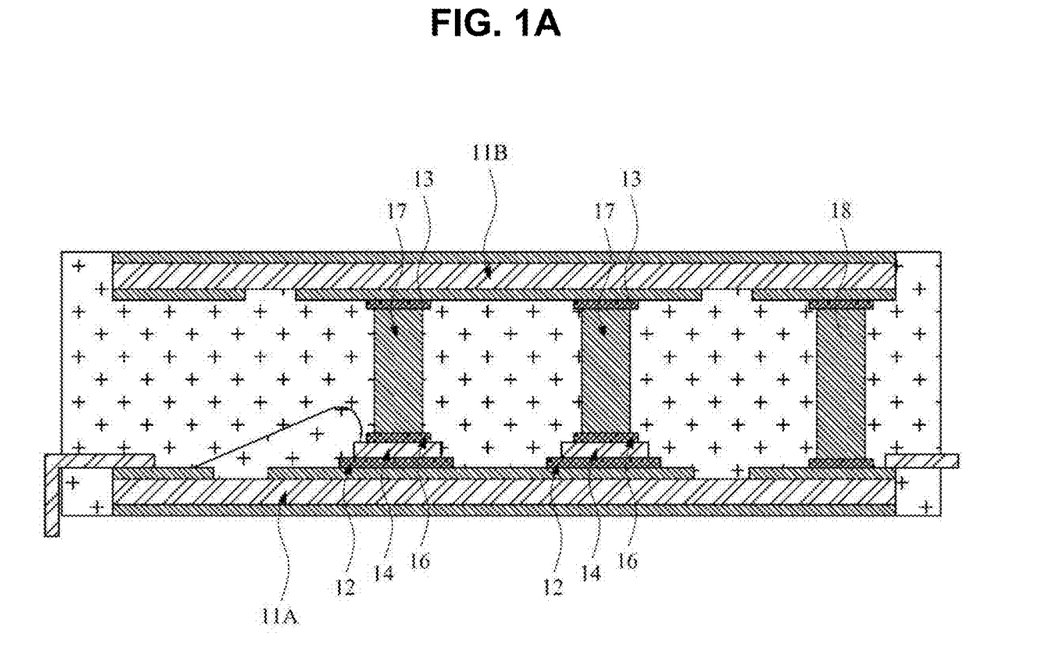
FIGS. 1A and 1B illustrate a conventional semiconductor package.

For example, in a conventional semiconductor package illustrated in FIG. 1A, a semiconductor chip 14 is bonded on a lower metal insulating substrate 11A by using a first bonding unit 12 interposed therebetween, and a vertical structured hexahedral or cylindrical conductor 17, which is a metal spacer, is bonded on the semiconductor chip 14 by using a second bonding unit 16 interposed therebetween and on an upper metal insulating substrate 11B by using a third bonding unit 13 interposed therebetween. Also, a metal bridge having a vertical structure is formed to electrically connect the lower metal insulating substrate 11A with the upper metal insulating substrate 11B.

Figure 1B:
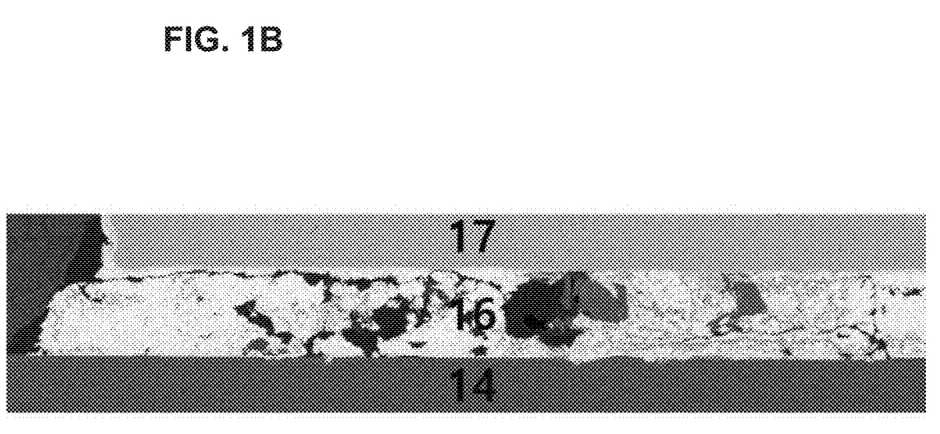

However, the semiconductor chip is respectively bonded to the substrates and the conductor by using a solder interposed therebetween and cracks are generated from the first bonding unit 12 or the second bonding unit 16 as illustrated in FIG. 1B due to a Coefficient of Thermal Expansion (CTE) difference between the substrates 11A and 11B and the conductor 17 and between the first bonding unit 12 and the second bonding unit 16. Accordingly, a reliability issue is generated.

That is, the main factor of the cracks generated in the bonding units due to a CTE difference is that a metal spacer bonded on the surface of a semiconductor chip is directly and vertically bonded to an upper metal insulating substrate and thereby, a mold pressurizes the upper metal insulating substrate and the metal spacer while performing molding for forming a package housing. Accordingly, the semiconductor chip is directly damaged and thus, a production yield is lowered.

In order to minimize a CTE difference with the semiconductor chip, a material having CTE similar to that of the semiconductor chip may be selected and used instead of the metal spacer or the metal post. However, the material is significantly expensive compared to the existing metal spacer or metal post and thereby, price competitiveness is lowered.

SUMMARY OF THE INVENTION

The present invention provides a semiconductor package in which a metal bridge, which is bent and has elasticity and a non-vertical structure, may protect a semiconductor chip in such a way that push-stress occurring while molding is relieved by being absorbed or dispersed by being diverted, a method of manufacturing the same, and the metal bridge applied to the semiconductor package.

According to an aspect of the present invention, there is provided a semiconductor package including: a first substrate including a specific metal pattern formed thereon to enable electrical connection; a second substrate facing the first substrate which is spaced apart from the first substrate and includes a specific metal pattern formed thereon to enable electrical connection; at least one semiconductor chip including one side bonded to the first substrate, the second substrate, or the first and second substrates by using a first conductive adhesive interposed therebetween; a metal bridge which is bent in a specific form to have elasticity, includes one end bonded to the other side of the semiconductor chip by using a second conductive adhesive interposed therebetween, and includes the other end bonded to the second substrate, the first substrate, or the first and second substrates by using a third conductive adhesive interposed therebetween; a package housing which covers at least a part of the semiconductor chips and the metal bridge; and at least one terminal lead which is electrically connected to the first substrate, the second substrate, or the metal bridge and is exposed to the outside of the package housing, wherein a horizontal bond distance H between both centers of the second conductive adhesive and the third conductive adhesive used to bond the metal bridge between the first substrate and the second substrate is 0.5 mm through 7 mm and a vertical bond distance V between one end and the other end of the metal bridge is 0.1 mm through 5 mm.

The first substrate or the second substrate may include one or more insulating layers.

The first substrate or the second substrate may be formed of a metal material or an insulating material.

The first substrate or the second substrate may have a stack structure comprising one or more metal layers, one or more insulating layers, and one or more metal layers.

The metal layers of the first substrate or the second substrate bonded to the first conductive adhesive or the metal layers of the second substrate or the first substrate bonded to the third conductive adhesive may have a thickness of 15 μm through 2 mm.

The metal bridge may have a thickness of 0.1 mm through 2 mm.

The metal bridge may have thermal conductivity of 200 W/(m-k) through 500 W/(m-k).

The metal bridge may include any one of Cu and Fe.

The first through third conductive adhesives may include any one of Ag, Cu, and Sn.

The first through third conductive adhesives may have a thickness of 10 µm through 500 µm.

The metal bridge may be bonded to the upper surfaces of the at least one semiconductor chip, extended and exposed outside of the package housing, and used as the terminal lead.

The metal bridge may be bonded to the upper surfaces of the at least one semiconductor chip, bonded to the first substrate, the second substrate, or the first and second substrates, extended and exposed outside of the package housing, and used as the terminal lead.

One end of the metal bridge may be bonded to the upper surfaces of the at least one semiconductor chip and the other end of the metal bridge may be bonded to the first substrate, the second substrate, or the first and second substrates.

One end of the metal bridge may be bonded to the upper surface of the at least one semiconductor chip and the other end of the metal bridge may be electrically connected to the at least one terminal lead.

One end of the terminal lead may be electrically connected to the first substrate, the second substrate, or the first and the second substrates disposed in the package housing by using connecting members.

The connecting members may be conductive adhesives which are used to electrically connect one end of the terminal lead to the first substrate, the second substrate, or the first and second substrates, or one end of the terminal lead may be directly and electrically connected to the first substrate, the second substrate, or the first and second substrates by ultrasonic welding.

At least a part of the first substrate, the second substrate, or the first and second substrates is exposed to the one surface of the package housing.

The thickness of the metal bridge bonded to the upper surfaces of the semiconductor chips may be greater than thicknesses of the insulating layers of the first substrate or the second substrate.

The semiconductor chip may be an insulated gate bipolar transistor (IGBT), a diode, a metal-oxide-semiconductor field-effect transistor (MOSFET), or a junction field effect transistor (JFET).

According to another aspect of the present invention, there is provided a semiconductor package using the semiconductor package described above to operate an inverter, a converter, or an on board charger (OBC).

According to another aspect of the present invention, there is provided a method of manufacturing the semiconductor package described above.

According to another aspect of the present invention, there is provided a metal bridge applied to the semiconductor package described above.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in more detail with reference to the accompanying drawings.

A semiconductor package according to an embodiment of the present invention includes a first substrate 110, a second substrate 120, at least one semiconductor chip 130, a metal bridge 140, a package housing 150, and at least one terminal lead 160, wherein the first substrate 110 includes a specific metal pattern formed thereon to enable electrical connection, the second substrate 120 facing the first substrate 110 is spaced apart from the first substrate 110 and includes a specific metal pattern formed thereon to enable electrical connection, the at least one semiconductor chip 130 includes one side bonded to the first substrate 110, the second substrate 120, or the first and second substrates 110 and 120 by using a first conductive adhesive 131 interposed therebetween, the metal bridge 140 is bent in a specific form to have elasticity, includes one end bonded to the other side of the semiconductor chip 130 by using a second conductive adhesive 141 interposed therebetween, and includes the other end bonded to the first substrate 110, the second substrate 120, or the first and second substrates 110 and 120 by using a third conductive adhesive 142 interposed therebetween, the package housing 150 covers at least a part of the semiconductor chips 130 and the metal bridge 140, and the terminal leads 160 are electrically connected to the first substrate 110, the second substrate 120, or the metal bridge 140 and are exposed to the outside of the package housing 150. Here, a horizontal bond distance H between both centers of the second conductive adhesive 141 and the third conductive adhesive 142 used to bond the metal bridge 140 between the first substrate 110 and the second substrate 120 is 0.5 mm through 7 mm. Also, a vertical bond distance V between one end and the other end of the metal bridge 140 is 0.1 mm through 5 mm. Accordingly, push-stress toward the semiconductor chips 130 generated while molding may be dispersed by the metal bridge 140 having elasticity.

Hereinafter, the semiconductor package mentioned above will be described in more detail with reference to FIGS. 2 through 6.

Firstly, the at least one semiconductor chip 130 is installed on the first substrate 110 which is a lower substrate including a specific metal pattern formed thereon to enable electrical connection.

Figure 5:
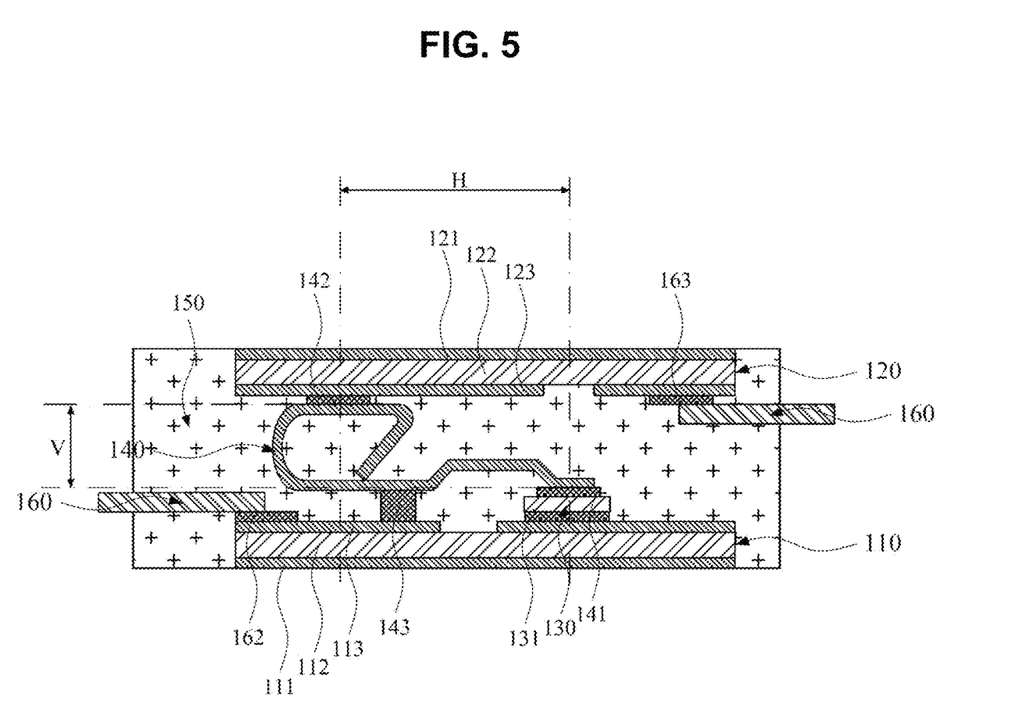
FIG. 5 illustrates a third example of the semiconductor package of FIG. 2.
Figure 6:
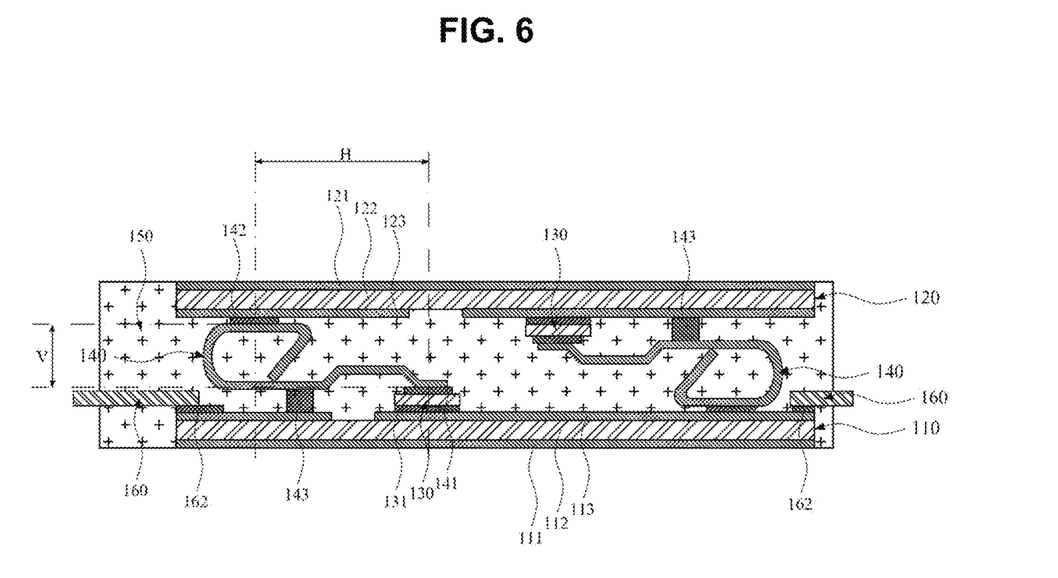
FIG. 6 illustrates a fourth example of the semiconductor package of FIG. 2.
Figure 7A:
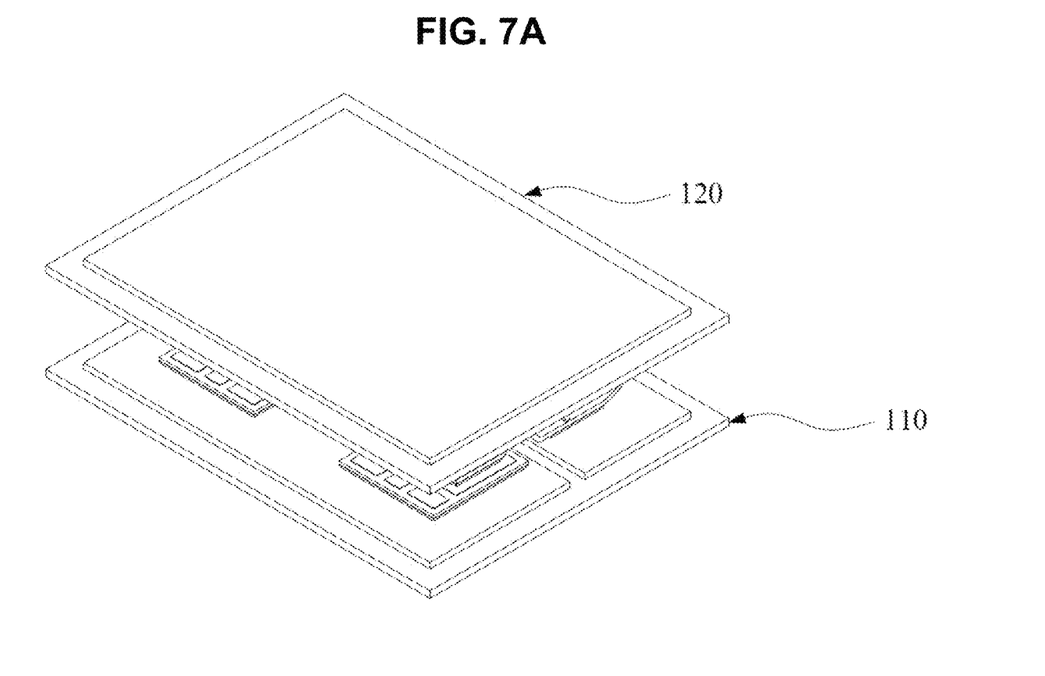
FIGS. 7A and 7B are perspective views of the semiconductor package in the third example illustrated in FIG. 5.
Figure 7B:
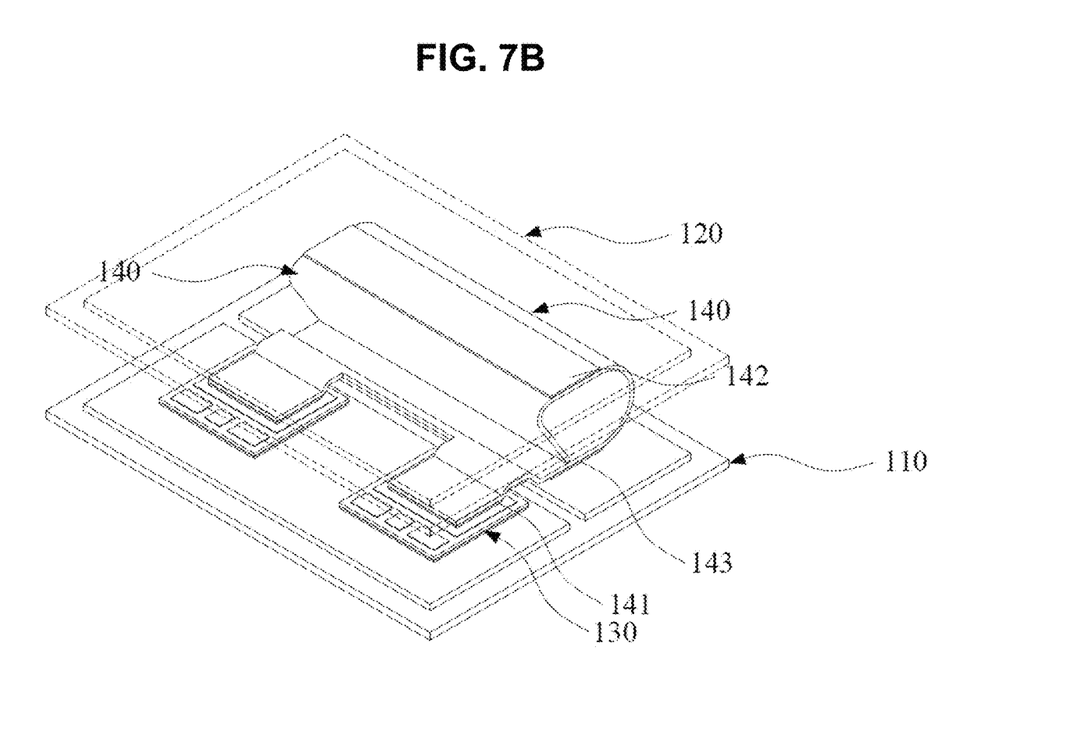
Figure 8:
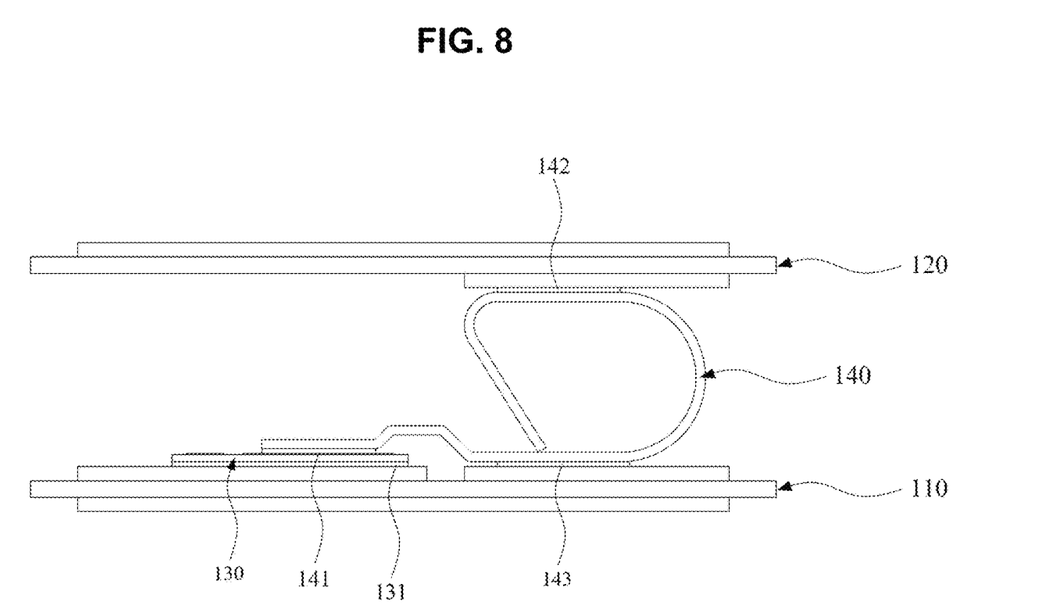
FIG. 8 illustrates a cross-sectional structure of the semiconductor package of FIGS. 7A and 7B.
Figure 9:
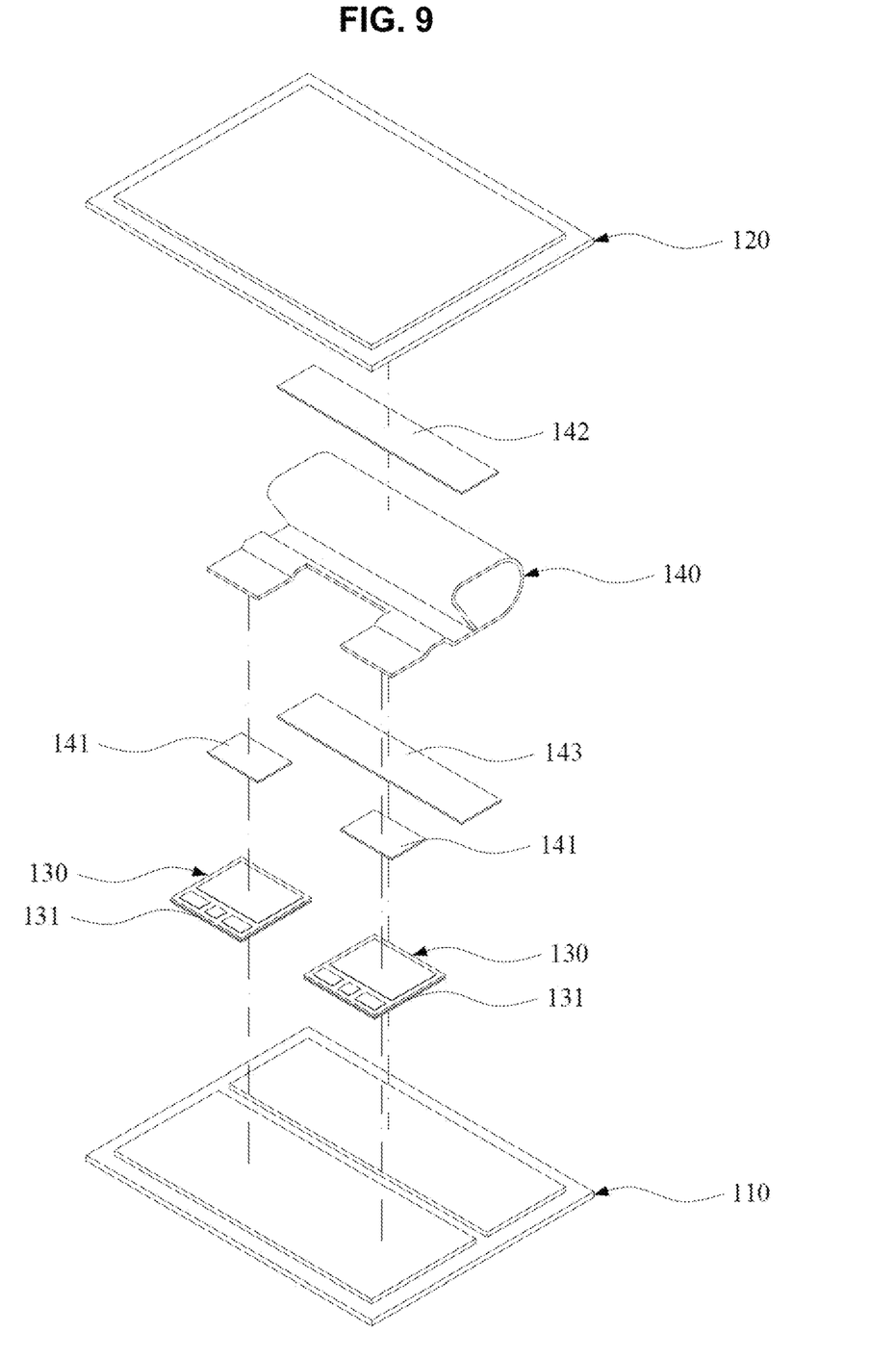
FIG. 9 is an exploded perspective view of the semiconductor package of FIGS. 7A and 7B.

Next, the second substrate 120, which is an upper substrate including a specific metal pattern formed thereon to enable electrical connection, faces and is spaced apart from the first substrate 110. As illustrated in FIGS. 2 through 5, the semiconductor chips 130 may not be installed on the second substrate 120 and as illustrated in FIG. 6, the semiconductor chips 130 may be installed on the second substrate 120.

Here, first substrate 110 or the second substrate 120 may include one or more insulating layers formed of $Al_2O_3$ (ceramic) or AlN.

Also, the first substrate 110 or the second substrate 120 may be formed of a metal material or an insulating material.

In addition, the first substrate 110 or the second substrate 120 may have a stack structure including one or more metal layers 111 and 121, one or more insulating layers 112 and 122 formed of $Al_2O_3$ (ceramic) or AlN, and one or more metal layers 113 and 123.

Moreover, the metal layers 113 and 123 may each have a thickness of 15 μm through 2 mm, wherein the metal layers 113 and 123 are included in the first substrate 110 or the second substrate 120 bonded to the first conductive adhesive 131, or the second substrate 120 or the first substrate 110 bonded to the third conductive adhesive 142. Here, the metal layers 113 and 123 may each be a single metal layer, an alloy metal layer, or a plated metal layer.

A thickness of the metal bridge 140 bonded to the upper surfaces of the semiconductor chips 130 may be greater than thicknesses of the insulating layers 112 and 122 of the first substrate 110 or the second substrate 120.

Next, one sides of the at least one semiconductor chips 130 are bonded on the first substrate 110 (refer to FIGS. 2 through 5), or the first substrate 110 and the second substrate 120 (refer to FIG. 6) by using the first conductive adhesive 131.

The semiconductor chip 130 is an insulated gate bipolar transistor (IGBT), a diode, a metal-oxide-semiconductor field-effect transistor (MOSFET), or a junction field effect transistor (JFET) and is used to operate devices such as an inverter, a converter, or an on board charger (OBC) that converts or controls electric power.

The metal bridge 140 is used as a spacer which is bonded and electrically connected to the semiconductor chips 130 and maintains a vertical bond distance V between the first substrate 110 and the second substrate 120. In addition, the metal bridge 140 is bent in a specific form to have elasticity and thereby, disperses push-stress occurring in a vertical direction by a mold (not illustrated) while molding of the first substrate 110, the second substrate 120, and the semiconductor chips 130. Accordingly, the semiconductor chips 130 may be less damaged and thus, durability thereof may be improved.

For example, one end of the metal bridge 140 is bonded to the other side of the semiconductor chip 130 by using the second conductive adhesive 141 interposed therebetween. Also, the other end of the metal bridge 140 may be bonded to the second substrate 120 by using the third conductive adhesive 142 interposed therebetween (refer to FIGS. 2 through 6) or may be bonded to each of the first substrate 110 and the second substrate 120 by using the third conductive adhesive 142 (refer to FIG. 2 (A)).

In particular, when the other end of the metal bridge 140 is each bonded the first substrate 110 and the second substrate 120 by using the third conductive adhesive 142, a gap between the center of the third conductive adhesive 142 formed on the first substrate 110 and the center of the third conductive adhesive 142 formed on the second substrate 120 may be alternately formed in a horizontal direction. In this regard, push-stress occurring in a vertical direction by a mold (not illustrated) while molding of the first substrate 110, the second substrate 120, and the semiconductor chips 130 may be dispersed. Accordingly, the semiconductor chips 130 may be less damaged and thus, durability thereof may be improved.

The metal bridge 140, which electrically connects the semiconductor chips 130 on the first substrate 110 to the second substrate 120, is bent more than once to have elasticity, and a metal bridge contact area bonded to the semiconductor chips 130 and the second substrate 120, that is, the center of the second conductive adhesive 141 and the center of the third conductive adhesive 142 are alternately formed in a horizontal direction Accordingly, the metal bridge 140 formed between the centers disperses push-stress occurring in a vertical direction by a mold and thereby, pressure may not be immediately or directly applied to the semiconductor chips 130 from the metal bridge 140.

Figure 2:
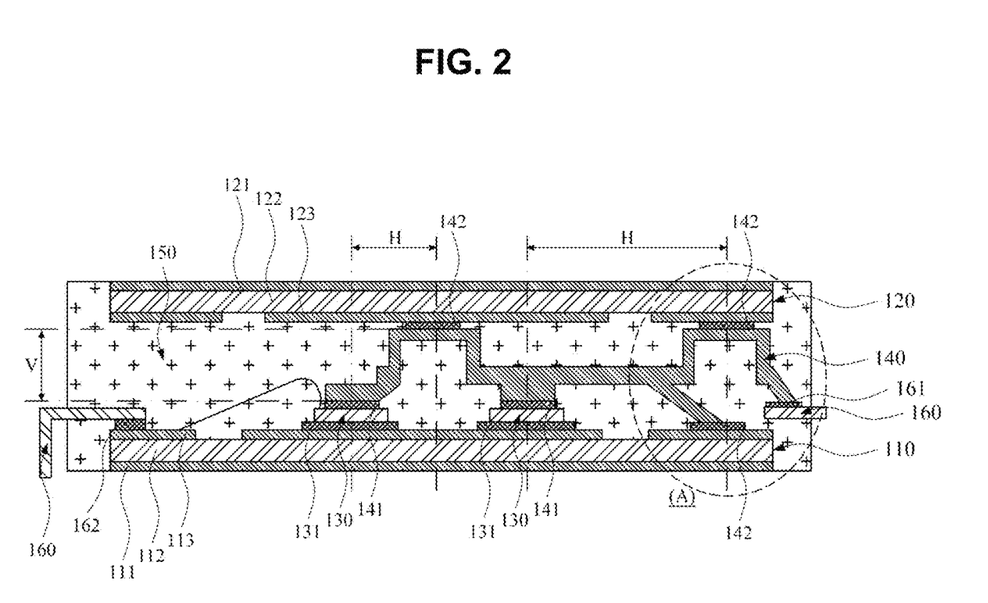
FIG. 2 illustrates a cross-sectional structure of a semiconductor package according to an embodiment of the present invention.
Figure 3:
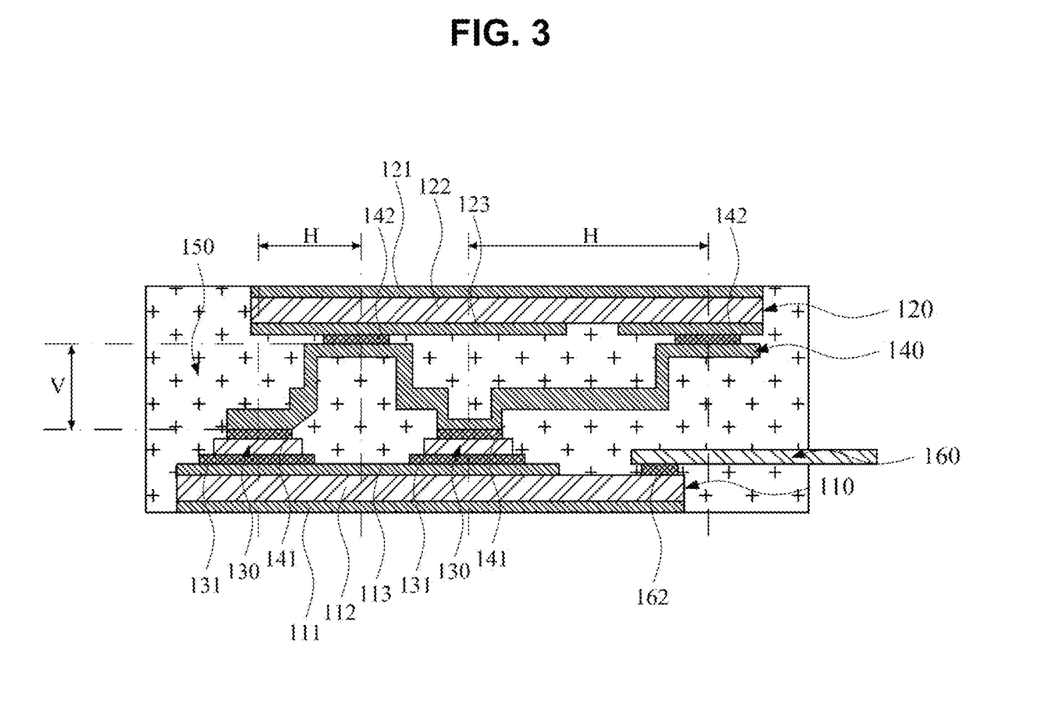
FIG. 3 illustrates a first example of the semiconductor package of FIG. 2.
Figure 4:
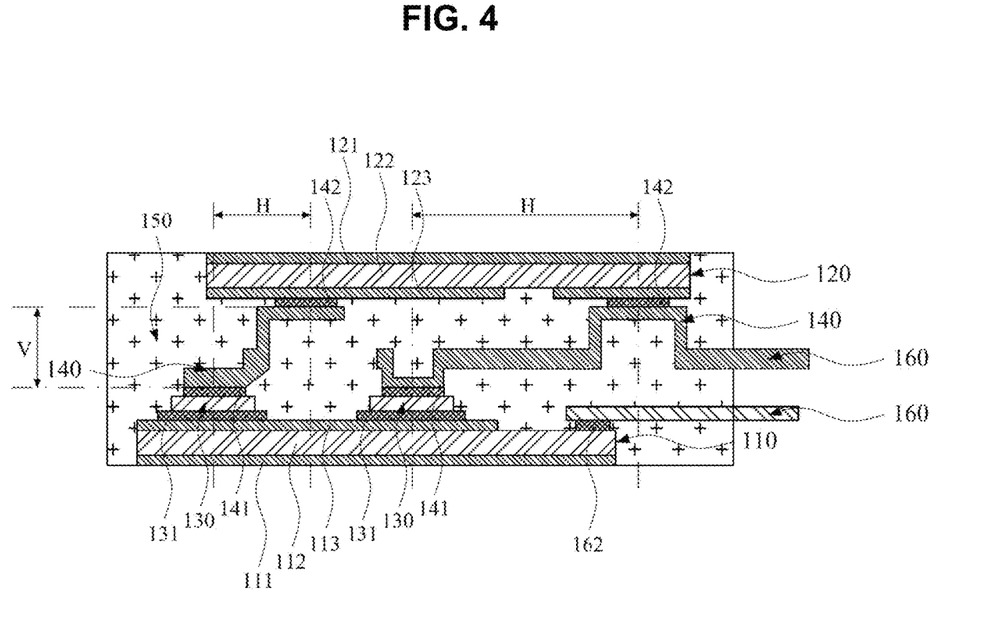
FIG. 4 illustrates a second example of the semiconductor package of FIG. 2.

More specifically, as illustrated in FIGS. 2 through 4, the metal bridge 140 is bent in a linear form and is bonded to the semiconductor chips 130 and the first substrate 110, or the semiconductor chips 130 and second substrate 120. Also, as illustrated in FIGS. 5 and 6, the metal bridge 140 may be bent in a clip form or a spring form between the semiconductor chips 130 and the first substrate 110, or the semiconductor chips 130 and second substrate 120. Here, the metal bridge 140 in a clip or spring form may be bonded to a separate adhesive 143 to be supported on the first substrate 110 or the second substrate 120. As illustrated in FIG. 5, the metal bridge 140 may be separately formed between the first substrate 110 and the second substrate 120 and as illustrated in FIG. 6, a pair of metal bridges 140 may be formed to have an inverted structure in a vertical direction between the first substrate 110 and the second substrate 120.

FIGS. 7A through 9 illustrate the semiconductor package in the third example of FIG. 5. According to the drawings, the clip-formed metal bridge 140 having a thickness of 0.2 mm is formed between the first substrate 110 and the second substrate 120 each of which is formed of Zirconia Toughened Alumina (ZTA) and has a thickness of 0.3 mm. Here, one side part of the metal bridge 140 in a linear form is bonded to the semiconductor chip 130 by using the second conductive adhesive 141 formed of a Sn solder, and the other side part of the metal bridge 140 in a closed curve form is bonded to the first substrate 110 by using the adhesive 143 formed of a Sn solder and to the second substrate 120 by using the third conductive adhesive 142 formed of a SAC305 (Sn 96.5%, Ag 3.0%, Cu 0.5%) solder. Accordingly, push-stress occurring between the first substrate 110 and the second substrate 120 while molding may not be directly transmitted to the semiconductor chips 130.

Figure 10A:
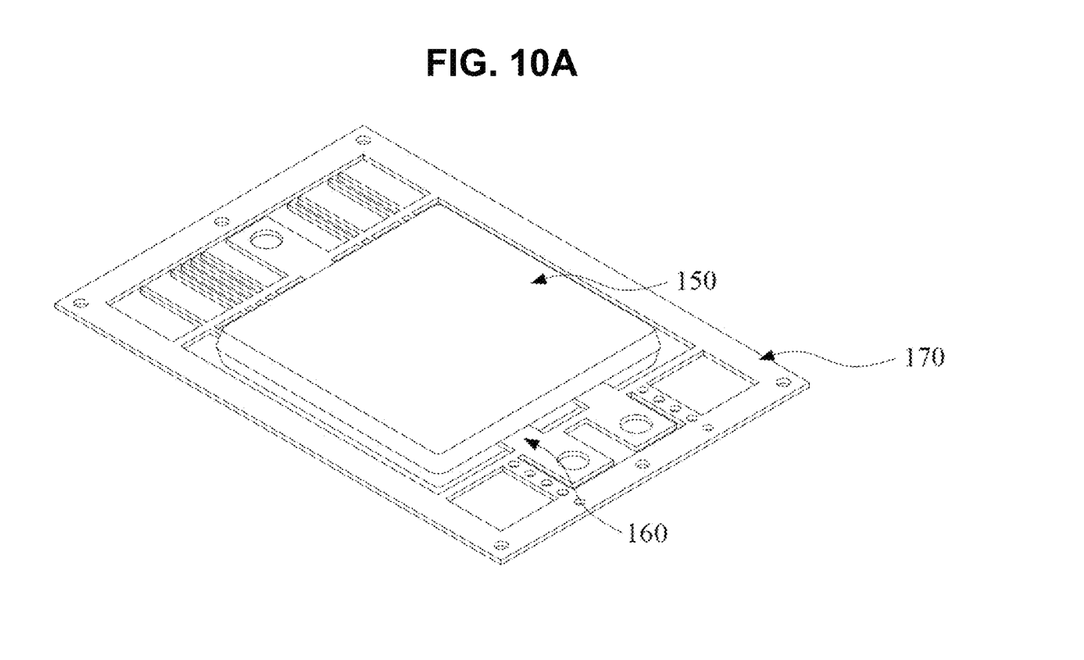
FIGS. 10A and 10B are designs of a product where the semiconductor package of FIGS. 7A and 7B is applied.
Figure 10B:
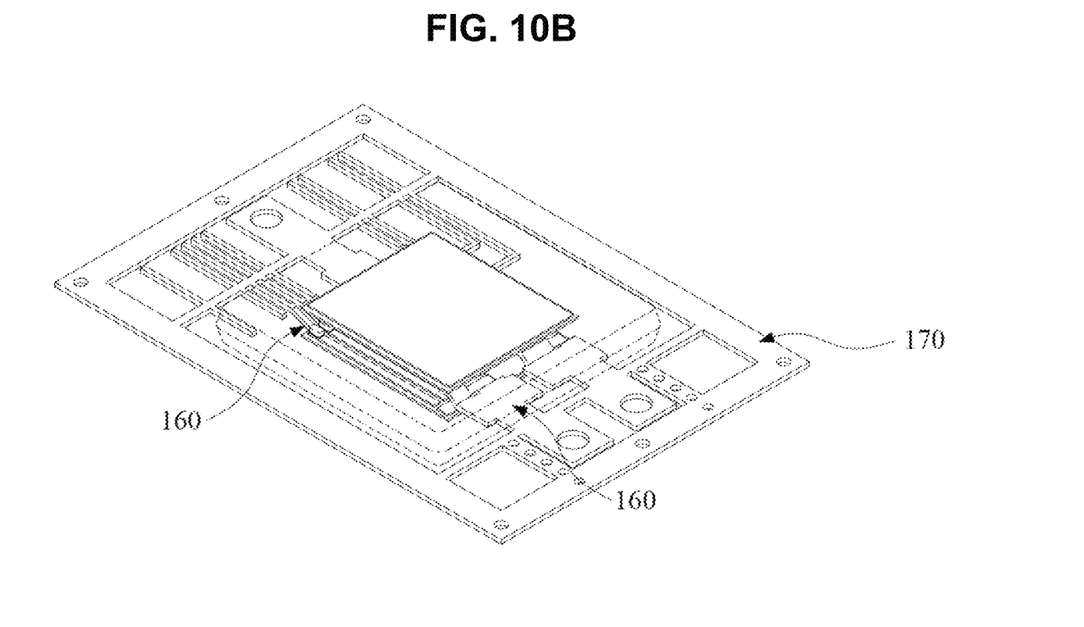
Figure 11:
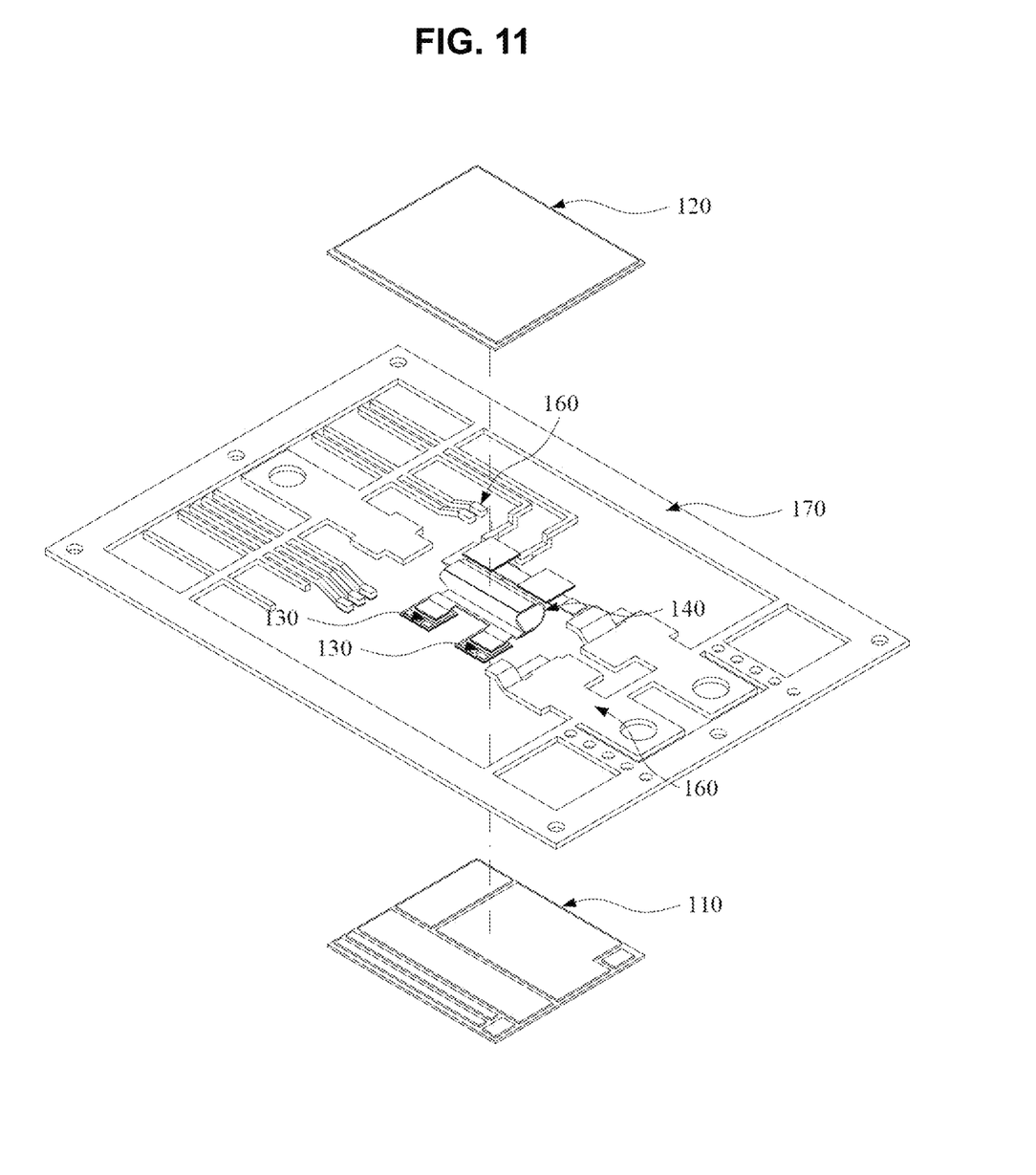
FIG. 11 is an exploded perspective view of the product of FIGS. 10A and 10B.

FIGS. 10A through 11 illustrate a lead frame 170 on which terminal leads 160 are patterned, wherein the terminal leads 160 are electrically connected to the first substrate 110 or the second substrate 120. Here, the semiconductor package described above is molded while the terminal leads 160 are partially exposed, and the package housing 150 is formed. Then, the lead frame 170 disposed outside of the package housing 150 is cut for productization.

In the current embodiment of the present invention, in order to disperse push-stress meaningfully, the horizontal bond distance H between both centers of the second conductive adhesive 141 and the third conductive adhesive 142 used to bond the metal bridge 140 between the first substrate 110 and the second substrate 120 may be 0.5 mm through 7 mm and the vertical bond distance V between one end and the other end of the metal bridge 140 may be 0.1 mm through 5 mm.

Also, the metal bridge 140 may have a thickness in the range of 0.1 mm through 2 mm to maintain the horizontal bond distance H and the vertical bond distance V.

In addition, since thermal conductivity of the metal bridge 140 is 200 W/(m-k) through 500 W/(m-k), excellent heat radiation may be available through the package housing 150, or the second substrate 120 and the first substrate 110 exposed outside of the package housing 150.

Moreover, the metal bridge 140 includes any one of Cu and Fe and thereby, may have excellent electric conductivity.

The first through third conductive adhesives 131, 141, and 142 may each include any one of Ag, Cu, and Sn, have excellent electric conductivity, and each have a thickness of 10 μm through 500 μm.

Although not illustrated, the metal bridge 140 is bonded to the upper surfaces of the at least one semiconductor chip 130 and is extended and exposed outside of the package housing 150. Accordingly, the metal bridge 140 may be used as not only a spacer but also the terminal lead 160.

Also, as illustrated in FIG. 4, the metal bridge 140 is bonded to the upper surfaces of the at least one semiconductor chip 130 and is bonded to the first substrate 110, the second substrate 120, or the first and second substrates 110 and 120. Here, the metal bridge 140 is extended and exposed outside of the package housing 150 and thus, the metal bridge 140 may be used as not only a spacer but also the terminal lead 160.

In addition, one end of the metal bridge 140 is bonded to the upper surfaces of the at least one semiconductor chip 130 and the other end of the metal bridge 140 may be bent to bond to the first substrate 110 only, the second substrate 120 only, or each of the first substrate 110 and the second substrate 120 (refer to FIGS. 2 through 4).

Moreover, as illustrated in FIG. 2 (A), one end of the metal bridge 140 is bonded to the upper surface of the at least one semiconductor chip 130 and the other end of the metal bridge 140 may be electrically connected to the at least one terminal lead 160 by using a conductive adhesive 161 interposed therebetween.

Next, the package housing 150 is formed of EMC, PBT, or PPS for insulation and covers and protects an internal circuit, for example, the entire semiconductor chips 130 and at least a part of the metal bridge 140. A part of the metal bridge 140 may be formed to be exposed to the outside of the package housing 150.

The at least one terminal lead 160 is electrically connected to the first substrate 110 (refer to FIGS. 2 through 6), the second substrate 120 (refer to FIG. 5), or the metal bridge 140 (refer to FIGS. 2, 4, and 5) and is exposed outside of the package housing 150. Accordingly, an electrical signal may be applied from the outside.

One end of the terminal lead 160 may be electrically connected to the first substrate 110 by using a connecting member 162 (refer to FIGS. 2, 3, 4 and 6), the second substrate 120 by using a connecting member 163, or the first substrate 110 and the second substrate 120 by respectively using the connecting members 162 and 163 (refer to FIG. 5), wherein the first and second substrates 110 and 120 are disposed in the package housing 150.

Here, the connecting members 162 and 163 are conductive adhesives which are used to electrically connect one end of the terminal lead 160 to the first substrate 110, the second substrate 120, or the first and second substrates 110 and 120. Also, one end of the terminal lead 160 may be directly and electrically connected to the first substrate 110, the second substrate 120, or the first and second substrates 110 and 120 by ultrasonic welding without using the connecting members.

In addition, at least a part of the first substrate 110, the second substrate 120, or the first and second substrates 110 and 120 may be exposed to the one surface of the package housing 150 and thus, heat generated while operating may be efficiently radiated. Here, an exposed surface of the first substrate 110 or the second substrate 120 exposed outside of the package housing 150 may additionally include a lattice arranged thereon, a radiation fin, or a radiation structure in a water cooling type or an air cooling type to enlarge a radiation area. Accordingly, heat generated while operating may be efficiently radiated and thereby, durability may be improved.

A method of manufacturing a semiconductor package according to another embodiment of the present invention includes preparing of the first substrate 110 and the second substrate 120, installing of the semiconductor chips 130 on the first substrate 110 or the second substrate 120, bonding of the bent metal bridge 140 having elasticity between the semiconductor chips 130 and the first or second substrate 110 or 120, electrically connecting of the terminal leads 160 to the first substrate 110, the second substrate 120, or the metal bridge 140, molding of the metal bridge 140 or the terminal leads 160 to be partially exposed, and forming of the package housing 160. Accordingly, push-stress generated while molding may be dispersed.

Also, in another embodiment of the present invention, the metal bridge 140 which is bent and has elasticity as mentioned above is applied to the semiconductor package.

Therefore, according to the semiconductor package, the method of manufacturing the same, and the metal bridge applied to the semiconductor package described above, a high-priced and a vertical-structured metal spacer formed of a material similar to CTE of the semiconductor chips may be replaced with a metal bridge which is bent and has elasticity, a non-vertical structure, and increased price competitiveness. Accordingly, the metal bridge may protect the semiconductor chip in such a way that push-stress occurring while molding is relieved by being absorbed or dispersed by being diverted. Also, cracks generated from the adhesives in the bonding areas interposed between the semiconductor chips and the metal bridge may be efficiently prevented.

According to the present invention, a high-priced and a vertical-structured metal spacer formed of a material similar to CTE of the semiconductor chips may be replaced with a metal bridge which is bent and has elasticity, a non-vertical structure, and increased price competitiveness. Accordingly, the metal bridge may protect the semiconductor chip in such a way that push-stress occurring while molding is relieved by being absorbed or dispersed by being diverted. Also, cracks generated from the adhesives in the bonding areas interposed between the semiconductor chips and the metal bridge may be efficiently prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A semiconductor package comprising:
   a first substrate comprising a specific metal pattern formed thereon to enable electrical connection;

a second substrate facing the first substrate which is spaced apart from the first substrate and comprises a specific metal pattern formed thereon to enable electrical connection;

a first semiconductor chip bonded to an upper surface of the first substrate;

a second semiconductor chip bonded to the upper surface of the first substrate;

a metal bridge which is bent in a specific form to have elasticity, wherein the metal bridge comprises:

a first contact portion bonded to an upper surface of the first semiconductor chip by using a first conductive adhesive;

a second contact portion bonded to a lower surface of the second substrate by using a second conductive adhesive; and a third contact portion bonded to an upper surface of the second semiconductor chip by using a third conductive adhesive;

a package housing which covers at least a part of the first and second semiconductor chips and the metal bridge; and at least one terminal lead which is electrically connected to the first substrate, the second substrate, or the metal bridge and is exposed to the outside of the package housing, wherein a first horizontal bond distance between a first center of the first conductive adhesive and a second center of the second conductive adhesive is 0.5 mm through 7 mm and a vertical bond distance between the first and second conductive adhesives is 0.1 mm through 5 mm, wherein the second center of the second conductive adhesive is horizontally positioned between the first center of the first conductive adhesive and a third center of the third conductive adhesive.

2. The semiconductor package of claim 1, wherein the first substrate or the second substrate (i) comprises one or more insulating layers, (ii) is formed of a metal material or an insulating material, or (iii) has a stack structure comprising one or more metal layers, one or more insulating layers, and one or more metal layers.

3. The semiconductor package of claim 1, wherein the metal layers of the first substrate or the second substrate bonded to the first conductive adhesive or the metal layers of the second substrate or the first substrate bonded to the third conductive adhesive have a thickness of 15 μm through 2 mm.

4. The semiconductor package of claim 1, wherein the metal bridge has a thickness of 0.1 mm through 2 mm.

5. The semiconductor package of claim 1, wherein the metal bridge has thermal conductivity of 200 W/(m-k) through 500 W/(m-k).

6. The semiconductor package of claim 1, wherein the metal bridge comprises any one of Cu and Fe.

7. The semiconductor package of claim 1, wherein the first through third conductive adhesives comprise any one of Ag, Cu, and Sn.

8. The semiconductor package of claim 1, wherein the first through third conductive adhesives have a thickness of 10 μm through 500 μm.

9. The semiconductor package of claim 1, wherein the metal bridge is extended and exposed outside of the package housing, and is used as the terminal lead.

10. The semiconductor package of claim 1, wherein one end of the metal bridge is electrically connected to the at least one terminal lead.

11. The semiconductor package of claim 2, wherein the thickness of the metal bridge bonded to the upper surfaces of the first and second semiconductor chips is greater than thicknesses of insulating layers of the first substrate or the second substrate.

12. The semiconductor package of claim 1, wherein one end of the terminal lead is electrically connected to the first substrate, the second substrate, or the first and the second substrates disposed in the package housing by using connecting members.

13. The semiconductor package of claim 12, wherein the connecting members are conductive adhesives which are used to electrically connect one end of the terminal lead to the first substrate, the second substrate, or the first and second substrates, or one end of the terminal lead is directly and electrically connected to the first substrate, the second substrate, or the first and second substrates by ultrasonic welding.

14. The semiconductor package of claim 1, wherein at least a part of the first substrate, the second substrate, or the first and second substrates is exposed to the one surface of the package housing.

15. The semiconductor package of claim 1, wherein each of the first and second semiconductor chips is an insulated gate bipolar transistor (IGBT), a diode, a metal-oxide-semiconductor field-effect transistor (MOSFET), or a junction field effect transistor (JFET).

16. The semiconductor package of claim 1, wherein the metal bridge further comprises a fourth contact portion bonded to the lower surface of the second substrate by using a fourth conductive adhesive.

17. The semiconductor package of claim 16, wherein the first horizontal bond distance between the first and second centers is different from a second horizontal bond distance between a third center of the third conductive adhesive and a fourth center of the fourth conductive adhesive.

18. The semiconductor package of claim 17, wherein the first horizontal bond distance is less than the second horizontal bond distance.

19. The semiconductor package of claim 1, wherein the metal bridge further comprises a fourth contact portion bonded to the upper surface of the first substrate by using a fourth conductive adhesive.

20. The semiconductor package of claim 1, wherein the metal bridge further comprises:

a fourth contact portion bonded to the lower surface of the second substrate by using a fourth conductive adhesive; and a fifth contact portion bonded to the upper surface of the first substrate by using a fifth conductive adhesive.

* * * * *